(12) United States Patent
Morimoto et al.

(10) Patent No.: US 8,048,767 B2
(45) Date of Patent: Nov. 1, 2011

(54) BONDED WAFER AND METHOD FOR PRODUCING BONDED WAFER

(75) Inventors: Nobuyuki Morimoto, Tokyo (JP); Akihiko Endo, Tokyo (JP)

(73) Assignee: Sumco Corporation, Tokyo (JP)

( * ) Notice: Subject to any disclaimer, the term of this patent is extended or adjusted under 35 U.S.C. 154(b) by 200 days.

(21) Appl. No.: 11/849,058

(22) Filed: Aug. 31, 2007

(65) Prior Publication Data

US 2008/0057676 A1  Mar. 6, 2008

(30) Foreign Application Priority Data

Aug. 31, 2006  (JP) .................................. 2006-235919

(51) Int. Cl.
*H01L 21/30* (2006.01)

(52) U.S. Cl. . 438/455; 257/627; 257/628; 257/E21.088; 438/459

(58) Field of Classification Search ........... 438/455–459
See application file for complete search history.

(56) References Cited

U.S. PATENT DOCUMENTS

| | | | | |
|---|---|---|---|---|
| 5,451,547 A * | 9/1995 | Himi et al. | ..................... | 438/455 |
| 5,966,625 A * | 10/1999 | Zhong et al. | ..................... | 438/492 |
| 6,086,670 A * | 7/2000 | Ito | ..................... | 117/13 |
| 6,261,928 B1 * | 7/2001 | Bruel | ..................... | 438/459 |
| 6,645,834 B2 * | 11/2003 | Akiyama | ..................... | 438/459 |
| 7,153,757 B2 * | 12/2006 | McCann et al. | ..................... | 438/455 |
| 7,411,274 B2 * | 8/2008 | Yamanaka et al. | ..................... | 257/627 |
| 2004/0087109 A1 | 5/2004 | McCann et al. | | |
| 2005/0101095 A1 * | 5/2005 | Fournel et al. | ..................... | 438/305 |
| 2005/0217560 A1 * | 10/2005 | Tolchinsky et al. | ..................... | 117/11 |
| 2006/0154442 A1 * | 7/2006 | de Souza et al. | ..................... | 438/455 |
| 2007/0215984 A1 * | 9/2007 | Shaheen et al. | ..................... | 257/618 |
| 2008/0164572 A1 * | 7/2008 | Toyoda et al. | ..................... | 257/616 |

FOREIGN PATENT DOCUMENTS

| | | |
|---|---|---|
| JP | 05-211128 | 8/1993 |
| JP | 11-067701 | 3/1999 |

OTHER PUBLICATIONS

M. Kittler et al., "Dislocation Engineering for a Silicon-Based Light Emitter at 1.5 μm", International Electron Devices Meeting, IEEE, Piscataway, NJ, pp. 1-4, Dec. 5, 2005.
X. Yu et al., "Properties of dislocation networks formed by Si wafer direct bonding", Materials Science in Semiconductor Processing, Elsevier Science Publishers B.V., Barking, UK, vol. 9, No. 1-3, pp. 96-101, Feb. 1, 2006.
European Search Report for Application No. 07016998.2-1235 dated Mar. 17, 2009.
Korean Office Action dated Sep. 29, 2008 (w/ English Translation of Relevant Parts).

* cited by examiner

*Primary Examiner* — Kiesha Bryant
*Assistant Examiner* — Eric Ward
(74) *Attorney, Agent, or Firm* — Sughrue Mion, PLLC

(57) ABSTRACT

A bonded wafer is produced by directly bonding a silicon wafer for active layer and a silicon wafer for support substrate without an insulating film and thinning the silicon wafer for active layer to a given thickness, in which a silicon wafer cut out from an ingot at a cutting angle of 0-0.1° (compound angle) with respect to a predetermined crystal face is used in each of the silicon wafer for active layer and silicon wafer for support substrate.

5 Claims, 2 Drawing Sheets

θx : Inclination angle in X-axis direction (cutting angle in X-axis direction)

θy : Inclination angle in Y-axis direction (cutting angle in Y-axis direction)

θ : Compound angle

θx : Inclination angle in X-axis direction
(cutting angle in X-axis direction)

θy : Inclination angle in Y-axis direction
(cutting angle in Y-axis direction)

θ : Compound angle (a)

(b)

BONDED WAFER AND METHOD FOR PRODUCING BONDED WAFER

BACKGROUND OF THE INVENTION

1. Field of the Invention

This invention relates to a bonded wafer and a method for producing a bonded wafer, and more particularly it is to suppress residual oxide in a bonded face as far as possible.

2. Description of the Related Art

As a typical production method of a bonded wafer, there are known a method wherein two silicon wafers are bonded through an insulating film such as an oxide film or the like or directly bonded without the insulating film and then a wafer for active layer is grinded and polished to form an active layer (grind-polishing method), and a method wherein ions of hydrogen or the like are implanted into a surface layer portion of a silicon wafer for active layer to form an ion-implanted layer and bonded to a silicon wafer for support substrate and then subjected to a heat treatment to exfoliate the wafer at the ion-implanted layer to thereby form an active layer (ion implanting separation method) or so-called smart cut method (registered trade mark) (see JP-A-H11-67701 and JP-A-H05-211128).

However, when the two silicon wafers are directly bonded after the removal of a native oxide by immersing in a HF solution, or particularly when two silicon wafers having different crystal orientations (for example, (110) face and (100) face) are directly bonded without using an insulating film such as an oxide film or the like, an oxide trapped in an interface therebetween may locally concentrate and retain in the interface as a step-like oxide in the production step of the bonded wafer (heat treatment step). As a result, there is a problem that such a residual oxide deteriorates the device characteristics but also forms a nucleus of defect in the preparation step of the device.

SUMMARY OF THE INVENTION

It is, therefore, an object of the invention to advantageously solve the above problems and to provide a method for producing a bonded wafer wherein the retaining of the oxide in the interface can be effectively removed when the two silicon wafers are directly bonded without the insulating film as well as a bonded wafer obtained by such a production method.

There will be described the development of the invention below. That is, when two silicon wafers are directly bonded without an insulating film, it is considered that an oxide retaining in a bonded interface is formed by condensing the oxide trapped in the bonded interface. In order to prevent the retaining of such an oxide, therefore, the bonding is usually conducted after the wafers are cleaned with a HF solution to remove a native oxide from the surface of the wafer.

Even when the surface of the wafer is cleaned with the HF solution or the like prior to the bonding, however, the step-like oxide may be retained in the bonded interface.

The inventors have made various studies in order to solve the above problems and obtained the following knowledge.

That is, when wafers to be bonded are cut out from an ingot, it is common that the cutting angle is not more than 1° in both of X-axis and Y-axis. However, it has been found that the retaining of the step-like oxide in the bonded interface can be effectively removed by strictly controlling the cutting angle from the ingot to a range of 0-0.1° (compound angle) with respect to a predetermined crystal face, and as a result the invention has been accomplished.

That is, the summary and construction of the invention are as follows.

1. A method for producing a bonded wafer by directly bonding a silicon wafer for active layer and a silicon wafer for support substrate without an insulating film and thinning the silicon wafer for active layer to a given thickness, characterized in that a silicon wafer cut out from an ingot at a cutting angle of 0-0.1° (compound angle) with respect to a predetermined crystal face is used in each of the said silicon wafer for active layer and silicon wafer for support substrate.

2. A method for producing a bonded wafer according to item 1, wherein the silicon wafers for active layer and for support substrate are bonded at a state of hydrophobic face.

3. A method for producing a bonded wafer according to item 1, wherein wafers having different crystal orientations are used as the silicon wafers for active layer and for support substrate.

4. A method for producing a bonded wafer according to item 1, wherein the thinning of the silicon wafer for active layer is carried out by an ion implantation-separation process.

5. A bonded wafer obtained by directly bonding a silicon wafer for active layer and a silicon wafer for support substrate without an insulating film and thinning the silicon wafer for active layer to a given thickness, characterized in that a silicon wafer cut out from an ingot at a cutting angle of 0-0.1° (compound angle) with respect to a predetermined crystal face is used in each of the said silicon wafer for active layer and silicon wafer for support substrate.

According to the invention, there cane be largely reduced the remnant of step-like oxide, which has been feared when the two silicon wafers are directly bonded without the insulating film.

DESCRIPTION OF THE PREFERRED EMBODIMENTS

The invention will be described in detail with reference to the accompanying drawings below.

In the invention, it is important that when a silicon wafer is cut out from an ingot, the cutting angle is controlled to a range of 0-0.1° (compound angle) with respect to a predetermined crystal face (which is also called as a standard face). When the cutting angle (compound angle) exceeds 0.1°, the step-like oxide retains in the bonded interface, which badly affects the preparation step of the device and properties thereof.

Figure 1:
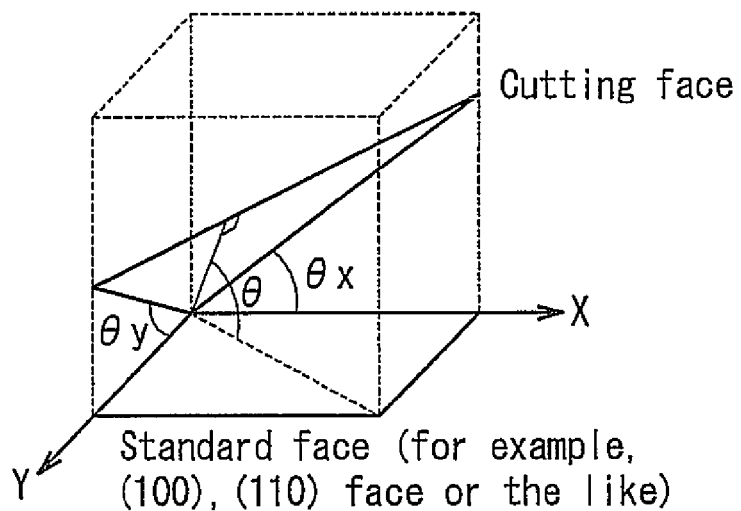
FIG. 1 is a schematic illustration of cutting angle and compound angle.

The term "cutting angle" used herein means an angle of the cut face with respect to X-axis or Y-axis of the standard face as shown in FIG. 1, while the compound angle θ compounding an inclination angle θx of the standard face in X-axis direction (cutting angle in X-axis direction) and an inclination angle θy of the standard face in Y-axis direction (cutting angle in Y-axis direction).

In the invention, it is also important that the compound angle of each of the two silicon wafers to be bonded is 0-0.1° because the remnant of the oxide can not be reduced if the compound angle of either of the wafer is controlled.

Although it is not yet clearly elucidated that the remnant of step-like oxide in the bonded interface can be largely reduced by controlling the cutting angle of each of the two silicon wafers from the ingot to a range of 0-0.1° (compound angle) according to the invention, the inventors have guessed as follows.

In the bonded interface, it seems that oxides are formed on the face of the wafer to be bonded and aggregated in the bonded interface and finally retain as step-like oxide. Therefore, it is considered that the remnant of the step-like oxide in the bonded interface can be suppressed by bonding silicon wafers each having a cut face substantially parallel to the standard face of the crystal.

In the bonding of the two silicon wafers, it is required to clean the surface of the wafer as far as possible. In the invention, it is advantageous that the surface of the wafer is rendered into a hydrophobic face by cleaning the wafer surface to remove native oxide film or the like before the bonding of the wafers. The term "hydrophobic face" used herein means a clean face having no oxide film and the like. Also, the cleaning method is not particularly limited, and can utilize the conventionally well-known method of cleaning in HF solution and the like.

Moreover, the invention is effective to the direct bonding of silicon wafers having different crystal orientations, for example, the direct bonding of (110) crystal and (100) crystal.

In the invention, an ion implantation-separation process with hydrogen gas or the like can be utilized as a method of thinning the wafer for active layer. This ion implantation-separation process is a method wherein a rare gas such as hydrogen gas or the like is implanted into the silicon wafer for active layer from its bonding face to form an ion implanted layer before the bonding and then the silicon wafer for active layer is bonded to the silicon wafer for support substrate and subjected to a heat treatment at about 500° C. to exfoliate a part of the wafer for active layer bounding the ion implanted layer. By using the ion implantation-separation process can be uniformly thinned the active layer without using a grinding, a polishing or an etching.

EXAMPLES

Example 1

When a silicon wafer is cut out from a silicon ingot grown by CZ method, a silicon wafer for active layer is cut at a compound angle of 0.07° with respect to (100) face as a standard face, and a silicon wafer for support substrate is cut at a compound angle of 0.07°. The thus obtained two silicon wafers are immersed in a HF cleaning solution to completely remove a native oxide film and directly bonded to each other and subjected to a heat treatment at 1100° C. for 120 minutes for further improving the bonding strength. Then, the wafer for active layer is ground and polished so as to render the thickness of the active layer into 100 nm.

An oxide existing in an interface of the thus obtained bonded wafer is observed by a plane TEM (transmission electron microscopy).

Figure 2:
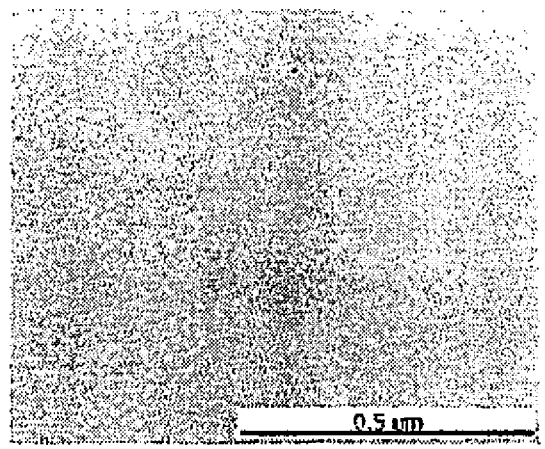
FIG. 2 is TEM photographs (a) and (b) of bonded interfaces of Example 1 and Comparative Example 1, respectively.
Figure 2:
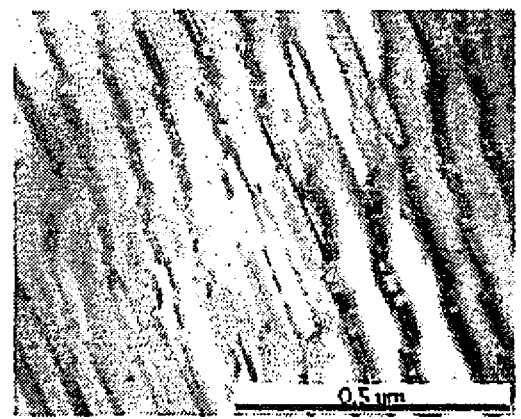

The measured result is shown in Table 1 and FIG. 2(a).

TABLE 1

|  | Compound angle of wafer for active layer (°) | Compound angle of wafer for support substrate (°) | Step-like oxide |
| --- | --- | --- | --- |
| Example 1 | 0.07 | 0.07 | none |
| Example 2 | 0.07 | 0.07 | none |
| Comparative Example 1 | 0.12 | 0.12 | presence |
| Comparative Example 2 | 0.12 | 0.12 | presence |

As seen from Table 1 and FIG. 2(a), in case of using the silicon wafers cut out from the ingot according to the invention, the remnant of the step-like oxide is not observed.

Example 2

When a silicon wafer is cut out from a silicon ingot grown by CZ method, a silicon wafer for active layer is cut at a compound angle of 0.07° with respect to (100) face as a standard face, and a silicon wafer for support substrate is cut at a compound angle of 0.07°. Then, hydrogen ions are implanted into the surface of the silicon wafer for active layer under conditions of an acceleration voltage: 50 keV and a dose: $1 \times 10^{17}$ atoms/cm$^2$ to form a hydrogen ion implanted layer at a depth position of about 500 nm from the surface of the wafer for active layer.

Then, the silicon wafers for active layer and for support substrate are immersed in HF cleaning solution to completely remove a native oxide film and directly bonded to each other and subjected to a heat treatment at 500° C. to exfoliate a part of the bonded wafer bounding the hydrogen ion implanted layer.

Next, the bonded wafer is subjected to a heat treatment at 1100° C. for 120 minutes for further improving the bonding strength and further to an oxidation treatment to thin the thickness of the active layer to 100 nm.

An oxide existing in an interface of the thus obtained bonded wafer is observed by the plane TEM.

The measured result is shown in Table 1.

In this case, the step-like oxide can not be observed likewise Example 1.

Comparative Example 1

A bonded wafer is prepared in the same manner as in Example 1 except that the compound angle of the silicon wafer for active layer is 0.12° and the compound angle of the silicon wafer for support substrate is 0.12°.

An oxide existing in an interface of the thus obtained bonded wafer is observed by the plane TEM to obtain a result as shown in Table 1 and FIG. 2(b).

As seen from Table 1 and FIG. 2(b), when the cutting angle of the silicon wafer is outside the acceptable range of the invention, the remnant of the step-like oxide is observed at the bonded interface.

Comparative Example 2

A bonded wafer is prepared in the same manner as in Example 2 except that the compound angle of the silicon wafer for active layer is 0.12° and the compound angle of the silicon wafer for support substrate is 0.12°.

An oxide existing in an interface of the thus obtained bonded wafer is observed by the plane TEM to obtain a result as shown in Table 1.

As seen from Table, the remnant of the step-like oxide is also observed likewise Comparative Example 1.

What is claimed is:

1. A method for preparing a silicon wafer, the method comprising:

bonding a first silicon wafer for use as an active layer and a second silicon wafer for use as a support substrate directly to each other, wherein each of the first silicon wafer and the second silicon wafer are cut out from an ingot at a cutting angle of greater than zero and less than or equal to 0.1° (compound angle) with respect to a predetermined crystal face having a predetermined crystal orientation; and wherein the first and second silicon wafers are subject to a cleaning process for sufficiently removing native oxide before said bonding is conducted so as to suppress formation of step-like oxide when bonding is conducted.

2. The method of claim 1, wherein the first silicon wafer and the second silicon wafer are bonded at a state of hydrophobic face.

3. The method of claim 1, wherein wafers having different crystal orientations are used as the first silicon wafer for the active layer and the second silicon wafer for use as the support substrate.

4. The method of claim 1, further comprising thinning the first silicon wafer for the active layer through an ion implantation-separation process.

5. The method of claim 1, comprising:

cutting one of the first silicon wafer and the second silicon wafer out from an ingot at a cutting angle of greater than zero and less than or equal to 0.1° (compound angle) with respect to a predetermined crystal face having one crystal orientation; and cutting another of the first silicon wafer and the second silicon wafer out from an ingot at a cutting angle of greater than zero and less than or equal to 0.1° (compound angle) with respect to a predetermined crystal face having another crystal orientation other than the one crystal orientation.

* * * * *